United States Patent
Ryu et al.

(10) Patent No.: US 10,289,486 B2
(45) Date of Patent: May 14, 2019

(54) MEMORY WITH PATTERN ORIENTED ERROR CORRECTION CODE

(71) Applicant: OmniVision Technologies, Inc., Santa Clara, CA (US)

(72) Inventors: Hoon Ryu, Sunnyvale, CA (US); Jong-Sik Na, San Ramon, CA (US); TaeHyung Jung, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/649,451

(22) Filed: Jul. 13, 2017

(65) Prior Publication Data

US 2019/0018732 A1    Jan. 17, 2019

(51) Int. Cl.
| | |
|---|---|
| *G06F 11/10* | (2006.01) |
| *G11C 29/52* | (2006.01) |
| *H03M 13/19* | (2006.01) |
| *H03M 13/29* | (2006.01) |

(52) U.S. Cl.
CPC .......... *G06F 11/1068* (2013.01); *G11C 29/52* (2013.01); *H03M 13/19* (2013.01); *H03M 13/2906* (2013.01)

(58) Field of Classification Search
CPC ............... G06F 11/1068; H03M 13/19; H03M 13/2906; H03M 13/151; G11C 29/52; G11C 2029/0411; G11C 29/42
USPC .......................................... 714/755, 763, 785
See application file for complete search history.

(56) References Cited

U.S. PATENT DOCUMENTS

| | | | | |
|---|---|---|---|---|
| 7,366,971 B2* | 4/2008 | Kikutake | ............ | G06F 11/1032 714/703 |
| 7,373,564 B2* | 5/2008 | Kikutake | ............... | G11C 29/10 365/201 |
| 7,493,531 B2* | 2/2009 | Ito | ......................... | G11C 11/406 714/708 |
| 7,543,218 B2* | 6/2009 | Chung | ............... | G11B 20/1833 714/763 |
| 7,761,780 B2* | 7/2010 | Kanai | ..................... | G06F 21/79 711/164 |
| 8,769,375 B2* | 7/2014 | Lee | ..................... | G06F 11/1068 714/763 |

(Continued)

*Primary Examiner* — James C Kerveros

(57) ABSTRACT

Apparatuses and methods for parity generations in error-correcting code (ECC) memory to reduce chip areas and test time in imaging system are disclosed herein. Memory tests are needed to catch hard failures and soft errors. Random and nondestructive errors are soft errors and are undesirable. Soft errors can be detected and corrected by the disclosed ECC which is based on Hamming code. Before data are written into memory, the first parity generator based on the disclosed ECC generates the first parity by calculating the data. The first parity and data are stored into the ECC memory as a composite word. When the previously stored word is fetched from the ECC memory, the second parity generator based on the disclosed ECC is used to generate the second parity. A comparison between the first and second parity leads to a disclosed error mask, which is used to correct a single bit error if the error only happens to a single bit of the fetched data. A minimum distance of three in the disclosed ECC is maintained to make certain that a single bit is corrected on the read data to retrieve the originally stored memory data.

20 Claims, 7 Drawing Sheets

(56) References Cited

U.S. PATENT DOCUMENTS

| | | | | |
|---|---|---|---|---|
| 8,924,814 B2* | 12/2014 | Feldman | ............ | G06F 11/1012 |
| | | | | 714/755 |
| 9,575,125 B1* | 2/2017 | Andre | .................... | G11C 29/10 |
| 2008/0034270 A1* | 2/2008 | Onishi | ................ | G06F 11/1048 |
| | | | | 714/758 |
| 2009/0089646 A1* | 4/2009 | Hirose | ................ | G06F 11/1048 |
| | | | | 714/766 |
| 2016/0203045 A1* | 7/2016 | Suzuki | ................ | G06F 11/1068 |
| | | | | 714/764 |

* cited by examiner

MEMORY WITH PATTERN ORIENTED ERROR CORRECTION CODE

TECHNICAL FIELD

This disclosure relates generally to memory, and in particular but not exclusively, relates to memory with error-correcting code (ECC), simply called ECC memory.

BACKGROUND INFORMATION

Image sensors have become ubiquitous. They are widely used in digital still cameras, cellular phones, security cameras, as well as, medical, automobile, and other applications. The technology used to manufacture and to test image sensors has continued to advance at a great pace. For example, the demands of higher resolution and higher pixel density have encouraged the advancement of memory systems, especially those with higher image data access rate and lower data error rate. The image data typically include a high number of bits. Conventional imaging systems may include on-board memory, such as dynamic random access memory (DRAM), to temporarily store the image data between receipt of the data and image generation based thereon. As the resolution and frame rate increases, the fidelity of the image data into and out of the on-board memory may become important. For example, error-correcting code (ECC) may be added to secure the fidelity of the image data, conventional memory may only configured with a conventional ECC like the Hamming code.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
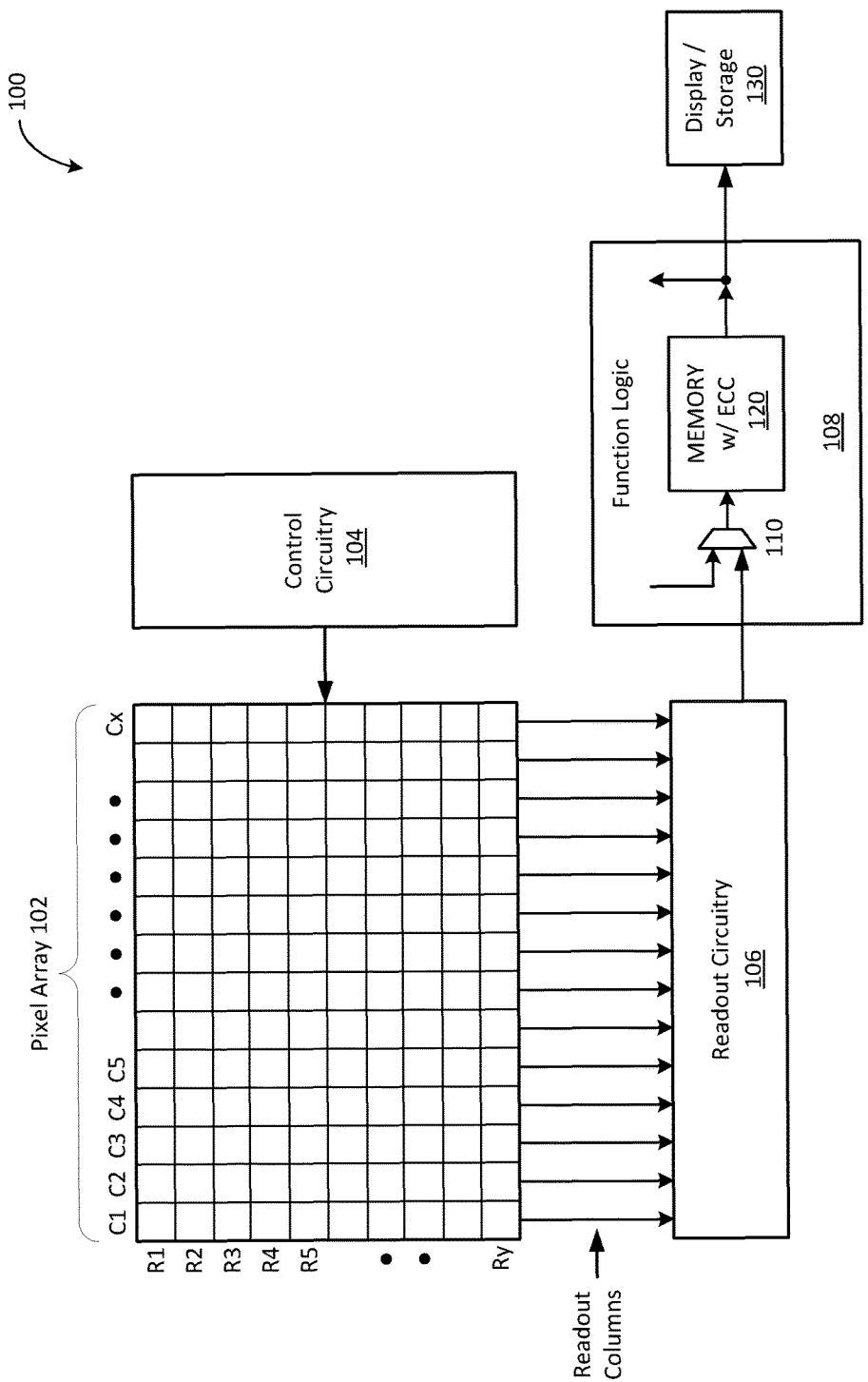
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an ECC memory are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 104, readout circuitry 106, function logic 108, and display/storage 130. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image charge through photo-generation of the image charge, corresponding image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. In one example, readout circuitry 106 may readout a row of image data at a time along readout column lines (illustrated) or may readout the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise).

In some embodiments, a multiplexer 110 and an ECC memory 120 may be included in the function logic 108. Contents of the ECC memory can be transferred to a display/storage 130.

In some embodiments, the display can be LCOS, LCD or LED and the storage can be nonvolatile memory, solid state drive, or hard disk drive.

Figure 2:
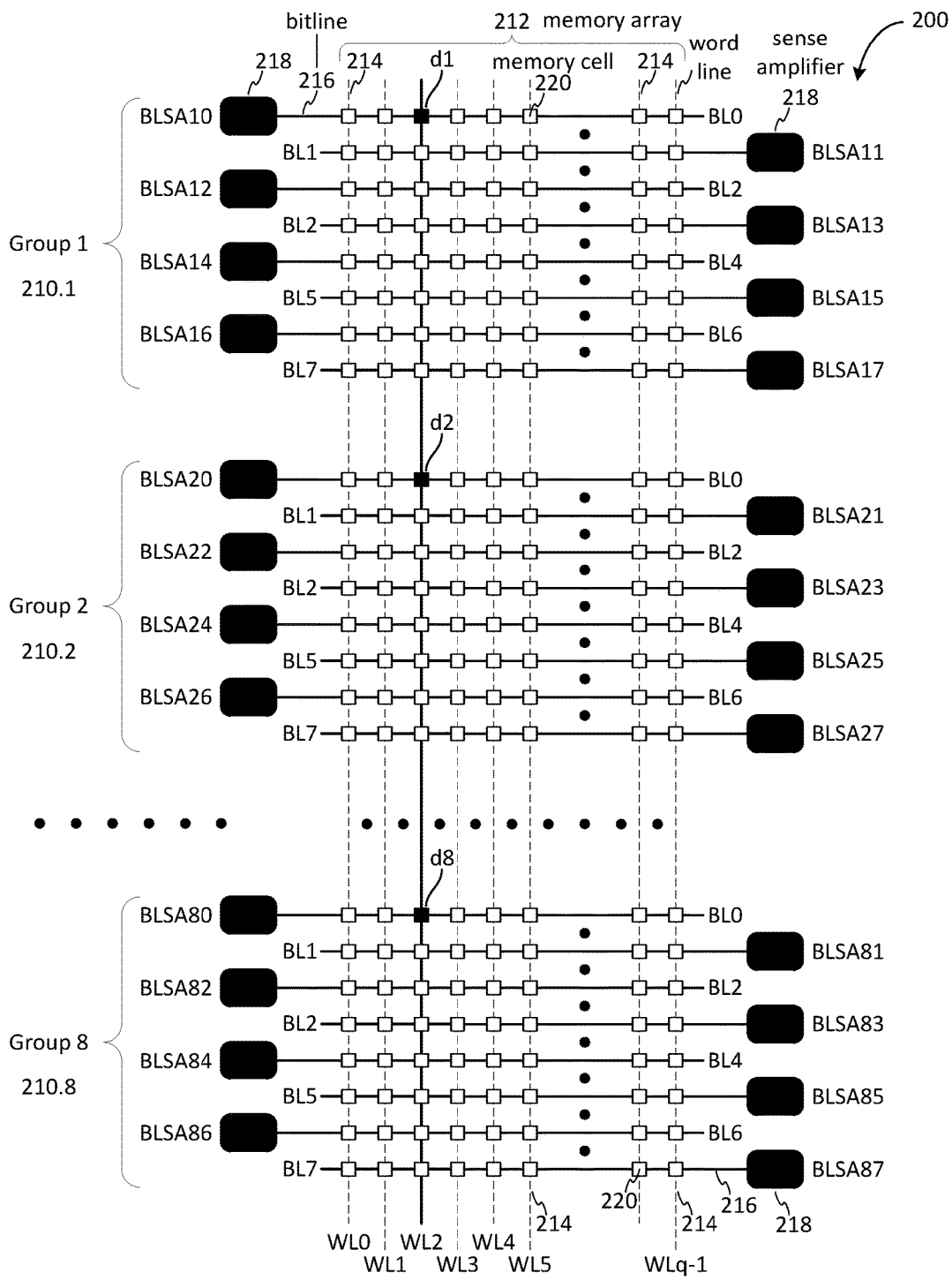
FIG. 2 is an example of a DRAM memory array in accordance with an embodiment of the present disclosure.

FIG. 2 is one example of a DRAM memory 200 in accordance with an embodiment of the present disclosure. The memory 200 may be an example of the ECC memory 120. The illustrated embodiment of memory 200 may include p data groups 210, where each data group 210 may include a memory array 212, a plurality of word lines (WL) 214, a plurality of bit lines (BL) 216, and a plurality of bit line sense amplifiers (BLSA) 218. Each memory array 212 may include r rows by q columns of memory cells 220. For one embodiment, r and q may be 8 and 8, respectively.

During memory test, DRAM 200 may need to apply certain patterns to its memory array 212. One example may be a chessboard pattern. Such chessboard pattern may be demonstrated in group i. For WL0, WL2, WL4 . . . , a plurality of memory cells 220 which are attached to BLSAi0, BLSAi2, BLSAi4, and BLSAi6 (i=1, 2, . . . , 8) may be set to logic value of 0; a plurality of memory cells 220 which are attached to BLSAi1, BLSAi3, BLSAi5, and BLSAi7 (i=1, 2, . . . , 8) may be set to logic value of 1. In the meantime, for WL1, WL3, WL5, . . . , a plurality of memory cells which are attached to BLSAi0, BLSAi2, BLSAi4, and BLSAi6 (i=1, 2, . . . , 8) may be set to logic 1; a plurality of memory cells which are attached to BLSAi1, BLSAi3, BLSAi5, and BLSAi7 (i=1, 2, . . . , 8) may be set to logic 0. Therefore, a chessboard pattern is achieved. A complimentary chessboard pattern is also used which flips all 0's of the original chessboard to 1's, and all 1's to 0's, In an alternative embodiment, commonly used two dimensional memory patterns may be formed by spreading a plurality of test patterns of 4 bits along each bit line repeatedly throughout the memory array 212. For example, a plurality of most frequently used test patterns to BLs may be 1010, 0101, 0110, 1001, 0000, and 1111, etc. The same test pattern is applied across the memory array 212, for a selected WLj (j=0, 1, . . . , 7) and BLSAij (i=1, 2, . . . , 8) with the same index j. Thevery same logic value of 0 or 1 may be observed for each group i(i=1, 2, . . . , 8), for example, BLSA13=BLSA23=BLSA33= . . . =BLSA83=1.

Figure 3:
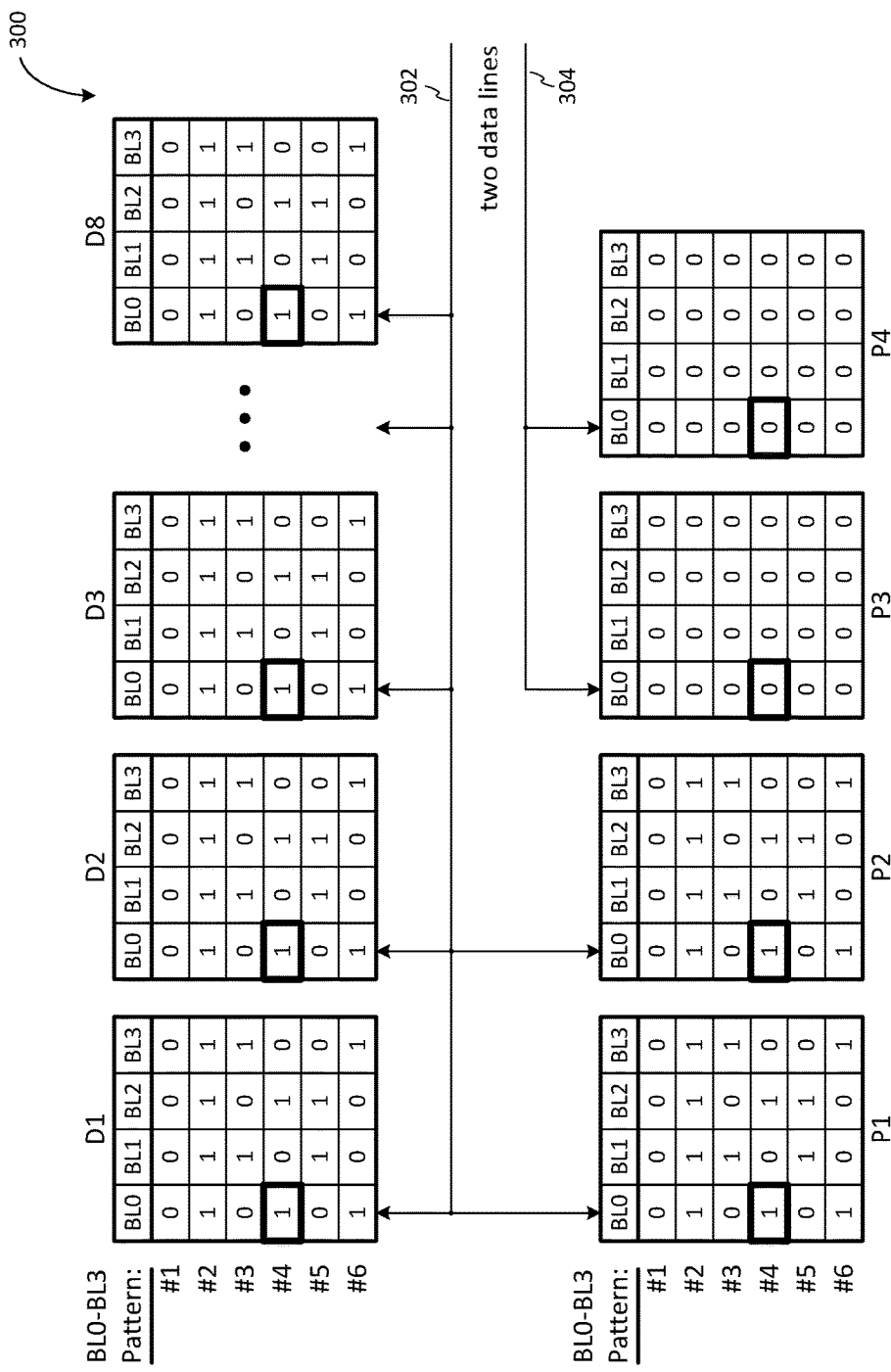
FIG. 3 is an example accessing data bits and parity bits using two data lines in accordance with an embodiment of the present disclosure.

In one example, word line WL2 may be selected out of a plurality of r rows and a plurality of BL0's of each group 210, and may be read out simultaneously. With such selections, memory cells d1, d2, . . . , d8 may be included in the following action, as illustrated in FIG. 2. In DRAM test, d1, d2, . . . , d8 may normally be set to the very same value of either 0 or 1. Therefore, a plurality of outputs of BL sense amplifier BLSA10, BLSA20, . . . , BLSA80 may be sensed together. In one example, 8 pieces of data which bear the same test pattern may be tested simultaneously to save test time. FIG. 3 shows a plurality of the most frequently used patterns that may be applied to BLs. They may be 0000, 1111, 0101, 1010, 0110, and 1001. In one example with pattern #4 listed in FIG. 3, for each D1, D2, . . . , D8, their {BL0, BL1, BL2, BL3}=1010. Therefore, a plurality of BL0's of data array D1, D2, . . . , D8 may all be 0's (or all 1's). Those BL0's may be connected all to a single data line 302, and being tested together.

All semiconductor memories are subject to test before use because such memory is subject to errors. By nature, there are two kinds of errors, hard failures and soft errors. A hard failure is a permanent physical defect. Memory cell or cells affected cannot reliably store data, but become stuck at 0 or 1 or switch erratically between 0 and 1. Hard errors can be caused by harsh environmental abuse, manufacturing defects, and wear and tear. A soft error is a random, nondestructive event that alters the contents of one or more memory cells, without damaging the memory cells. Soft errors can be caused by power supply problems or cosmic rays like alpha particles. These particles result from radioactive decay and are distressingly common because radioactive nuclei are found in small quantities in nearly all materials. Both hard and soft errors are clearly undesirable, and most memory systems include function logic for both detecting and correcting errors.

When data are to be written into memory, a calculation is performed on the data to produce a code called parity. Both the parity and data are stored into the memory. Thus, if an M-bit data is to be stored, and its parity has a length of K bits, the actual size of the stored word would be M+K bits. When the previously stored word is read out, both the stored data and stored parity are used to make judgments on whether errors have happened to the stored data or not.

A new set of K check bits is calculated based on the stored M data bits, and is compared with the stored K parity bits. The comparison of K check bits and K parity bits yields one of the three results. (1) No errors are detected, the fetched data bits are error free; (2) An error is detected, and it is possible to correct the error if the error only happens to a single bit; (3) An error is detected, but it is not possible to correct it if the error happens to more than one bit. The stored M data bits plus the M error correction bits are fed into a corrector, which produces a corrected data of M bits to be sent out. In general, codes operate in this fashion are referred to as error-correcting codes (ECC).

One of the most common and effective error-correcting codes is called Hamming code. Hamming codes are a family of linear error-correcting codes. In the Hamming code, for a data word of M bits, K parity bits are added to form a new composite word of M+K bits. The code is named as Hamming(M+K, M). The basic Hamming code can correct an error in only a single bit. Sometimes, multiple-bit errors are detected, but they may be corrected erroneously, since multiple-bit error are still treated as if they were single-bit errors, and are falsely processed by the Hamming code. Error of more than one bit is a real problem. In the Hamming code, the bit positions are numbered in sequence from 1 to M+K. Positions numbered with powers of two are reserved for the parity bits.

As a binary linear code, Hamming code has a minimum distance of three. The minimum distance is the minimum number of bit changes needed to distinguish between any two valid composite words in a Hamming code. A minimum distance of three in a Hamming code makes it possible for a decoder to detect and correct a single error, and detect double-bit errors if correction is not attempted.

In an example of Hamming (12, 8), a data word has 8 bits [d8, d7, d1], and its parity has 4 bits [p4, p3, p2, p1], the composite word of 12 bits is laid out as shown in the table.

| | Bit Position | | | | | | | | | | | |
|---|---|---|---|---|---|---|---|---|---|---|---|---|
| | 12 | 11 | 10 | 9 | 8 | 7 | 6 | 5 | 4 | 3 | 2 | 1 |
| Position Number | 1100 | 1011 | 1010 | 1001 | 1000 | 0111 | 0110 | 0101 | 0100 | 0011 | 0010 | 0001 |
| Data bit | d8 | d7 | d6 | d5 | | d4 | d3 | d2 | | d1 | | |
| Parity | | | | | p4 | | | | p3 | | p2 | p1 |

|  | Bit Position | | | | | | | | | | | |
|---|---|---|---|---|---|---|---|---|---|---|---|---|
| bit | 12 | 11 | 10 | 9 | 8 | 7 | 6 | 5 | 4 | 3 | 2 | 1 |
| Stored w | 1 | 1 | 0 | 0 | 0 | 0 | 1 | 1 | 1 | 0 | 0 | 0 |
| Fetched | 1 | 1 | 0 | 1 | 0 | 0 | 1 | 1 | 1 | 0 | 0 | 0 |
| Calclted Parity |  |  |  |  | 1 |  |  |  | 1 |  | 0 | 1 |
| Check b |  |  |  |  | 1 |  |  |  | 0 |  | 0 | 1 |
| Err msk | 0 | 0 | 0 | 1 |  | 0 | 0 | 0 |  | 0 |  |  |
| EC data | 1 | 1 | 0 | 0 |  | 0 | 1 | 1 |  | 0 |  |  |

Where XOR denotes exclusive-OR operation, and
p1=XOR of (d1, d2, d4, d5, d7)
p2=XOR of (d1, d3, d4, d6, d7)
p3=XOR of (d2, d3, d4, d8)
p4=XOR of (d5, d6, d7, d8)

For example, if original data bits [d8, d7, d6, d5, d4, d3, d2, d1]=1100_0110, their parity bits [p4, p3, p2, p1]=0100, the stored composite word bits are 1100_0011_1000. If an error happens to d5 with a change from 0 to 1, the fetched data [fd8, fd7, fd6, fd5, fd4, fd3, fd2, fd1]=1101_0110, and the fetched parity [pf4, pf3, pf2, pf1]=0100. Based on the fetched data, the calculated parity [pc4, pc3, pc2, pc1]=1101. Check bits [cb4, cb3, cb2, cb1] are
cb1=pf1 XOR pc1=0 XOR 1=1
cb2=pf2 XOR pc2=0 XOR 0=0
cb3=pf3 XOR pc3=1 XOR 1=0
cb4=pf4 XOR pc4=0 XOR 1=1

[cb4, cb3, cb2, cb1]=1001 indicates the error bit happens at position numbered 1001, that's data bit d5 based on the table above. Error mask [em8, em7, em6, em5, em4, em3, em2, em1]=0001_0000 is generated by a decoder. The decoder sets a 1 to where d5 is located to correct the fetched data. As a result, the error corrected data bits are
ecd1=fd1 XOR cb1=0 XOR 0=0
ecd2=fd2 XOR cb2=1 XOR 0=1
ecd3=fd3 XOR cb3=1 XOR 0=1
ecd4=fd4 XOR cb4=0 XOR 0=0
ecd5=fd5 XOR cb5=1 XOR 1=0
ecd6=fd6 XOR cb6=0 XOR 0=0
ecd7=fd7 XOR cb7=1 XOR 0=1
ecd8=fd8 XOR cb8=1 XOR 0=1

As can be seen, the error corrected data bits restored the original data bits after applying the ECC mechanism of the Hamming code.

A conventional Hamming ECC typically incurs a size and/or test time penalty due to the difference in the stress (where 0's and 1's are placed into pattern in data bits) between data bits and ECC generated parity bits. As such, more efficient ECC code in memory may be desirable that may be used in components that possess small form factors or area resources.

Hamming codes are perfect codes to be used because they achieve the highest possible rate for codes with their block length and a minimum distance of three. Hamming distance is the minimum number of difference in bits between any two valid two composite words of M+K bits. According to information theory, a code with a minimum Hamming distance d between any valid composite words can detect at most d−1 errors, and can correct (d−1)/2 errors. For d=3, two errors can be detected, and one error can be corrected.

In one embodiment, for a Hamming code with 4 parity bits, if all 4 bits are 0000, it may mean that no errors are detected. The use of all four 0 bits may take one choice away from all combinations which a 4-bit parity can be decoded to. The total number of bits that can be used in a coded composite word may at most be $2^4-1=15$. Of the 15 bits, 4 bits are already taken by the parity, which may leave up to 15−4=11 bits for the data. This is designated as Hamming (15, 11). In one example, one may apply a 4-bit parity to 8-bit data, that is designated as Hamming(12, 8). Each parity bit is calculated following these parity functions, where P1, P2, P3 and P4 represent parity bits:
P1=XOR of bits (D1, D2, D4, D5, D7)
P2=XOR of bits (D1, D3, D4, D6, D7)
P3=XOR of bits (D2, D3, D4, D8)
P4=XOR of bits (D5, D6, D7, D8)

The exclusive-OR (XOR) operation performs the odd function. It is equal to 1 for an odd number of 1's among the input variables and to 0 for an even number of inputs 1's. FIG. 3 shows exactly this function being used to calculate for parity bits P1, P2, P3, and P4. The 8 data bits of D1, D2, . . . , D8 out of the same BLs were used on the right hand side of the functions. For example, P1=P2=1 because of odd number (5) of inputs; P3=P4=0 because of even number (4) of inputs.

A calculation for a 4-bit parity based on Hamming(12, 8) may reach the same results as that of the Hamming(15, 11). However, based on Pattern #4 and BL0's from FIG. 3, we may observe that although D1=D2= . . . =D8=1, and P1=P2=1, but P3=P4=0. For the same BL0 values of 1, there are two sets of parity patterns formed, one with 1 (the same as the data bit), the other with 0. That means that an additional data line 304 may be needed to test P3 and P4, since P3 and P4 are different from P1 and P2 in value. As a result, an additional surface area may be occupied to accommodate a second data line 304. Furthermore, during the test, for the same data pattern, since P2 is not equal to P3, two tests through two data lines 302 and 304 may be needed for two test data patterns. This is the problem one may face if a standard Hamming(12, 8) is used in calculations in FIG. 3. Improvement is desired to simplify the parity operation.

Figure 4:
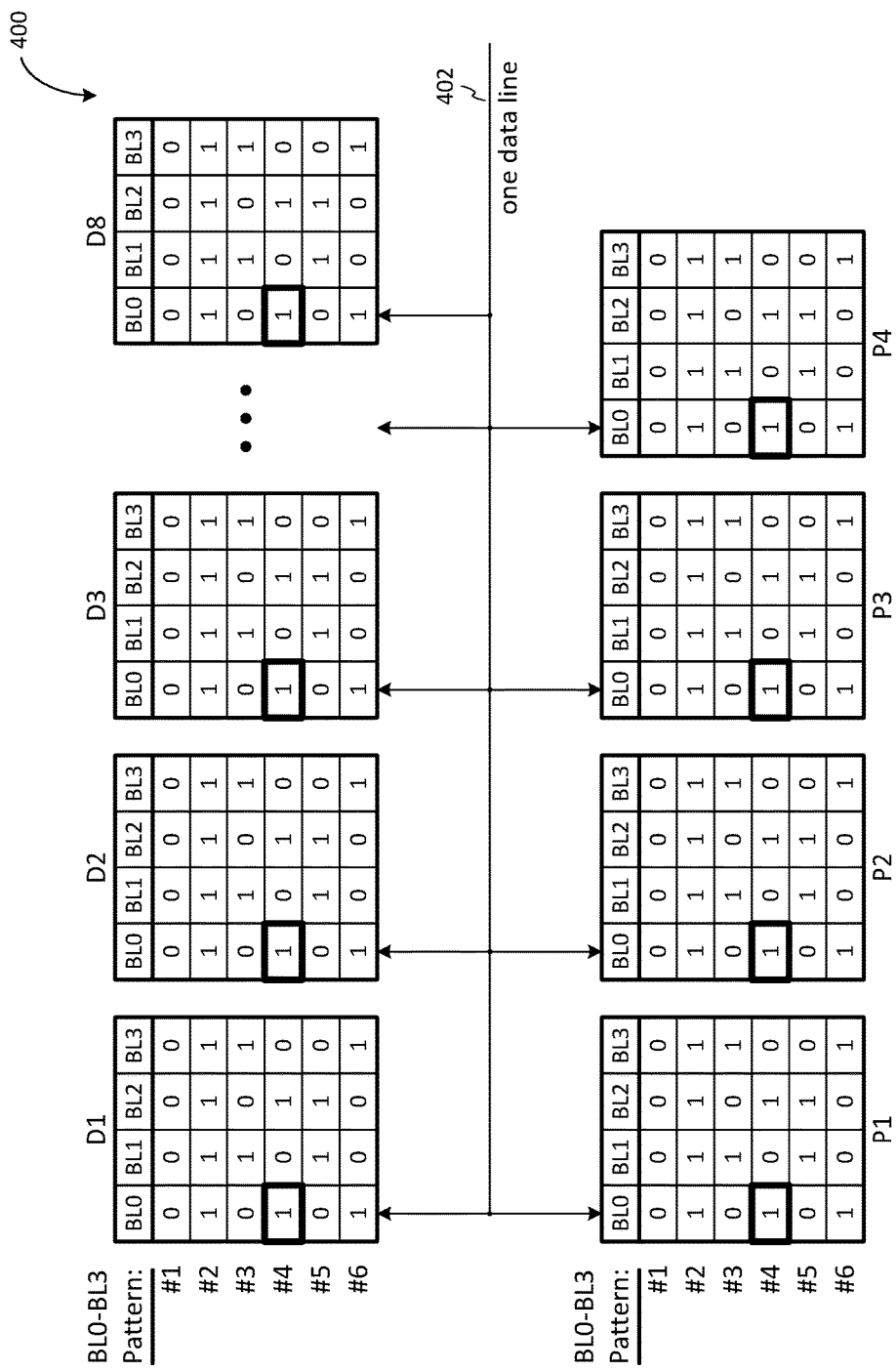
FIG. 4 is an example accessing data bits and parity bits using one data line in accordance with an embodiment of the present disclosure.

FIG. 4 is one example that accesses data bits and parity bits using one data line in accordance with an embodiment of the present disclosure. FIG. 4 discloses this invention that uses only one data line 402 for the test purposes. To overcome the difference between the 4-bit pattern for data and 4-bit pattern for parity in stress, in one embodiment, each parity bit is calculated following these parity functions:
P1=XOR of bits (D1, D2, D4, D5, D7)
P2=XOR of bits (D1, D3, D4, D6, D7)
P3=XOR of bits (D2, D3, D4, D5, D8)
P4=XOR of bits (D3, D5, D6, D7, D8)

These functions are different from the previously disclosed set of function. The present set of function makes sure that P1=P2=P3=P4=1, and D1=D2= . . . =D8=1. In particular, P3=P4=1 because of odd number (5) of inputs, just like P1 and P2. These functions may also make sure that calculated parity bits secure a minimum distance of three, and is still capable of correcting one-bit errors.

In this disclosure, the number (8) of bits for data and the number (4) of bits for parity are for illustrative purposes only, and should not be considered limiting to the present disclosure. Moreover, the 5 bits out of the 8-bit D1, D2, ..., D8 used to calculate for each P1, P2, P3, and P4 on the right hand side of the above equations are for illustrative purposes only, and should not be considered limiting to the present disclosure. These combinations may not be unique. There may be other functions that may also satisfy all the said conditions and benefits. The reason may be that for a 4-bit parity Hamming code, it is capable of indicating and correcting a single bit out of 11 data bits, as originally designated by Hamming(15, 11). In the current embodiment, Hamming(12, 8) is used. Since data have 8 bits, only 8 bit locations need to be indicated out of 11 capabilities. This means that there are 11−8=3 redundant possibilities. The existence of redundant bits may make it possible that the combinations in parity functions are not unique. Other combinations may reach exactly the same goal.

In one embodiment, such combination can be calculated using following functions:
P1=XOR of bits (D1, D2, D4, D5, D7)
P2=XOR of bits (D1, D3, D4, D6, D7)
P3=XOR of bits (D2, D3, D4, D6, D8)
P4=XOR of bits (D4, D5, D6, D7, D8).

In another embodiment, such combination can be calculated using following functions:
P1=XOR of bits (D1, D2, D4, D5, D7)
P2=XOR of bits (D1, D3, D4, D6, D7)
P3=XOR of bits (D1, D2, D3, D4, D8)
P4=XOR of bits (D4, D5, D6, D7, D8)
For given number of parity bits of 4 and data bits of 8, a total of 28 such combinations exist.

Figure 5:
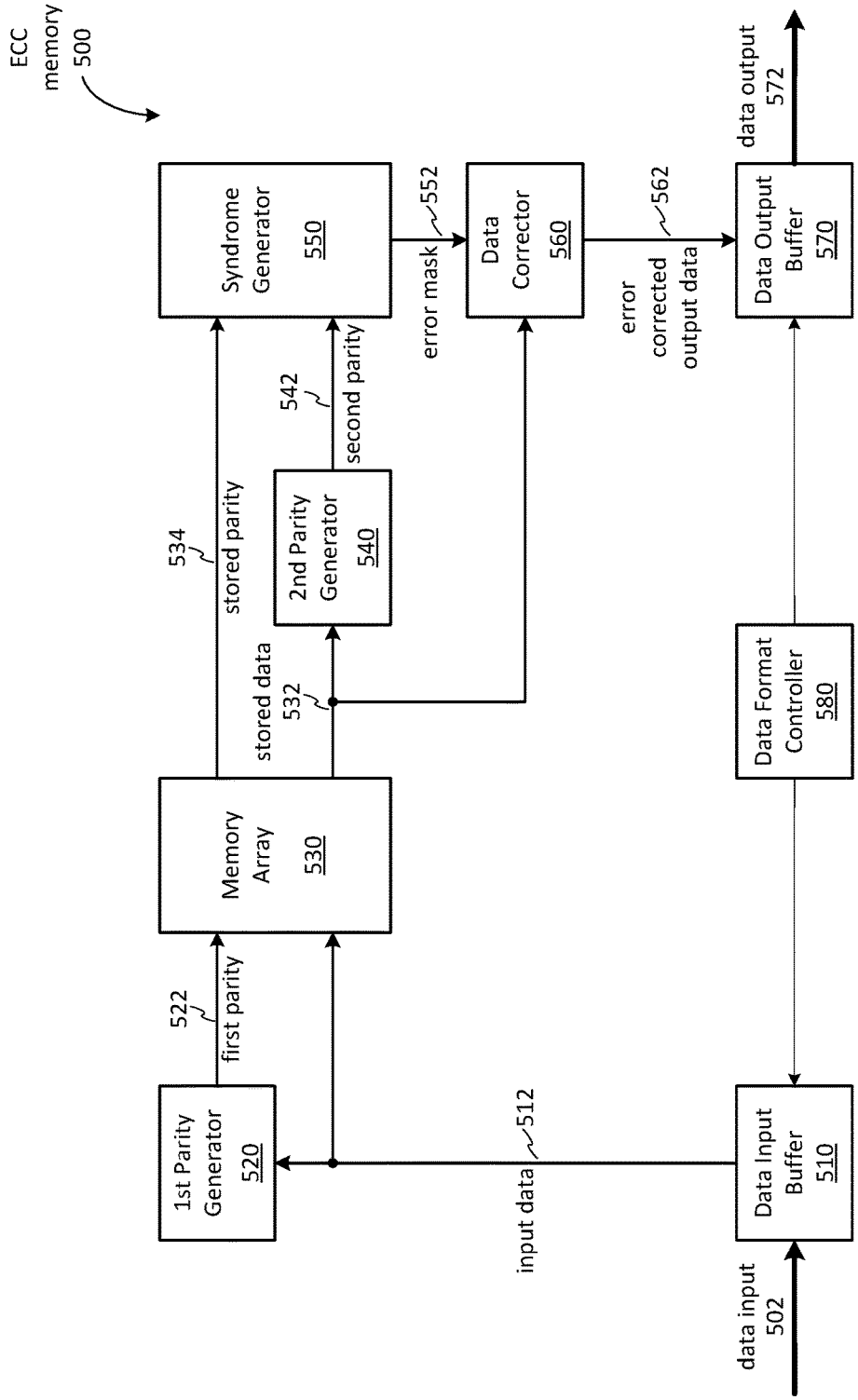
FIG. 5 is an example schematic of block diagram of an ECC memory in accordance with an embodiment of the present disclosure.

FIG. 5 is an example schematic of block diagram of a memory in accordance with an embodiment of the present disclosure. In FIG. 5, ECC memory 500 is the same as memory 120 in FIG. 1. During data readout of pixel array 102, readout circuitry 106 provides image data to data multiplexer 110. To perform data acquisition, multiplexer 110 opens to introduce a data input 502 to a data input buffer 510. The data input buffer 510 partitions a very wide (192 bits) data input 502 into a plurality of relatively narrower (8 bits) internal data packages. Then, each of the same bits of the plurality of the internal data packages are extracted to form a plurality of input data 512 of m bits. For example, m=8.

Next, the input data 512 of m bits is introduced to the first parity generator 520, wherein ECC of k-bit parity is calculated based on the parity functions disclosed in the description related to FIG. 4, and wherein n bits out of them bits of the input data 512 is used, and wherein k and n are both smaller than m. At the output of parity generator 520, first parity 522 of k bits is provided as a conversion of input data 512. After the ECC calculation, both the input data 512 of m bits and first parity 522 of k bits are ready to be written to the memory array 530. In one embodiment, m, k, and n may be 8, 4 and 5, respectively.

When the memory array 530 is fetched at its output, a stored data 532 (e.g., 8 bits) and a stored parity 534 (e.g., 4 bits) are obtained at the same time. The stored parity 534 is fed into a second parity generator 540, where a second parity (SP) 542 of k bits is calculated based on a second parity function set. The parity function of the second parity generator 540 may be preferred to be the same as that of the first parity generator 520, or it may be different. After the calculation, the stored parity (MP) 534 and the second parity (SP) 542 are compared in a syndrome generator 550. Check bits (CB) are calculated bit-by-bit with exclusive-OR of MP 534 and SP 542. The equations for a case of a 4-bit parity are shown below to calculate the CB.
CB1=MP1 XOR SP1
CB2=MP2 XOR SP2
CB3=MP3 XOR SP3
CB4=MP4 XOR SP4

Where XOR designated exclusive-OR operation. If the stored parity (MP) 534 and the second parity (SP) are the same bit-by-bit, then CB1=CB2=CB3=CB4=0. That may mean that there is no error detected, so there is no need to correct the fetched stored data 532. If not all CB1, CB2, CB3, and CB4 are 0's, there must be error(s) in the stored data 532. If there is only one bit in error, check bits can fix it inside data corrector 560 by an error mask (EM) 552. The error mask 552 is the output of the syndrome generator 550.

The error mask 552 has the same number of bits as that of the stored data 532, for example, 8 bits. Each of its bits is to be complimented (i.e., switching 0 and 1) with stored data 532 inside data corrector 560. The error mask (EM) may correct any single bit error of stored data 532. Each bit of EM 552, i.e., EM1, EM2, ..., EM8, may be decoded based on the check bits CB1, CB2, CB3, and CB4 through the following functions.
EM1=CB1 AND CB2 AND~CB3 AND~CB4
EM2=CB1 AND~CB2 AND CB3 AND~CB4
EM3=~CB1 AND CB2 AND CB3 AND CB4
EM4=CB1 AND CB2 AND CB3 AND~CB4
EM5=CB1 AND~CB2 AND CB3 AND CB4
EM6=~CB1 AND CB2 AND~CB3 AND CB4
EM7=CB1 AND CB2 AND~CB3 AND CB4
EM8=~CB1 AND~CB2 AND CB3 AND CB4

Wherein ~ is an operation of logic inversion, NOT. This decoding function may change in response to the changes of the parity functions of the first parity generator 520.

When an EM bit equals 0, it is used to preserve a data bit. When an EM bit equals to 1, it is used to correct a data bit by flipping the data bit from 0 to 1, or 1 to 0.

The error mask 552 and stored data (MD) 532 may be fed into the following functions to reach an error corrected output data (ECOD) 562.
ECOD1=EM1 XOR MD1
ECOD2=EM2 XOR MD2
ECOD3=EM3 XOR MD3
ECOD4=EM4 XOR MD4
ECOD5=EM5 XOR MD5
ECOD6=EM6 XOR MD6
ECOD7=EM7 XOR MD7
ECOD8=EM8 XOR MD8

Finally, ECOD 562 is fed into a data output buffer 570. Inside 570, data is collected and filled with a plurality of the error corrected output data 562 until the plurality of input data 512 from the data input 502 in data input buffer 510 has been fully processed and the data output butter 570 has been completely filled by the error corrected output data 562. At this point, Data Format Controller 580 sends out a signal to indicate that data appear at an output port of Data Output Buffer 570 is ready to be fetched as data output 572. Data output 572 is reconstructed in a reverse order based on how data input 502 is split by the Data Format Controller 580 in Data Input Buffer 510. Data output 572 can be sent to display/storage 130. In one embodiment, data output 572 can be an image data that may be sent to display by LCOS, LCD, or LED, etc. In another embodiment, 572 can be image data or any other form of general data or application data that can be saved in storage such as nonvolatile memories, solid state memories, or internal/external hard disk drive, etc.

In order to achieve test coverage under the same time, parity pattern may be calculated to be the same as the data pattern. When all memory arrays 212 are stored with the same data pattern, corresponding bits at the same bit location may have the same value of 0 or 1. As shown in one embodiment in FIG. 2, one may have either d1=d2= . . . =d8=0 or d1=d2= . . . =d8=1. This is the same as D1=D2= . . . D8=P1=P2=P3=P4=0 or D1=D2= . . . =D8=P1=P2=P3=P4=1 as shown in FIG. 4. Under either condition of all 1's or all 0's, only one data line may be necessary to test all the data and the data parity stored in the ECC memory body.

Figure 6:
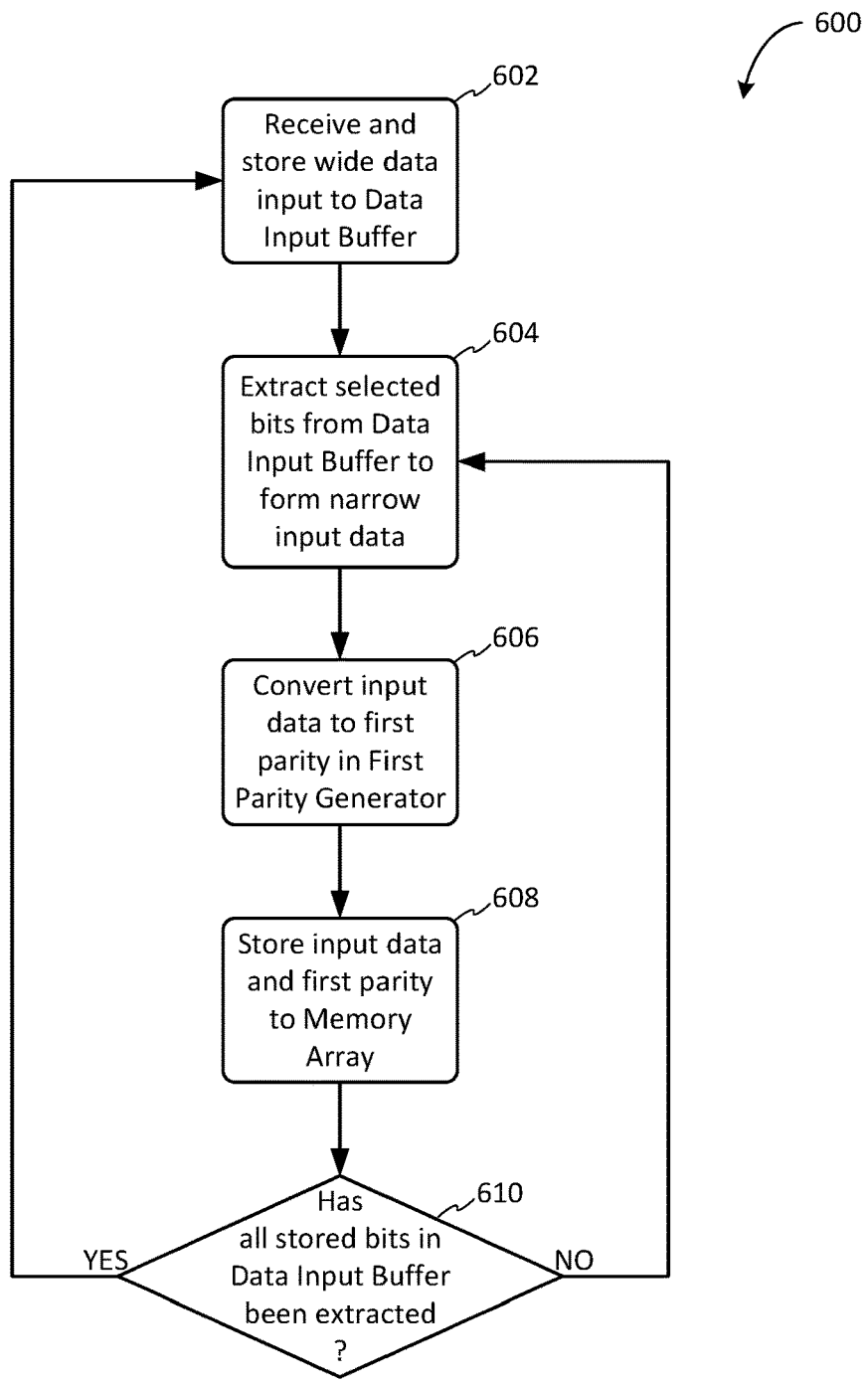
FIG. 6 is an illustrative flow chart of data write in accordance with an embodiment of the present disclosure.

FIG. 6 is an illustrative flow chart 600 of data write in accordance with an embodiment of the present disclosure. The flow chart 600 may illustrate a write process of an ECC memory using the disclosed function logic of the parity generator. The flow chart may begin at Receive and store buffer block 602, which includes the wide data input 502 being received from an environment that requires data storage.

In one embodiment, the so-called wide data input 502 may be 192 bits in data width. Data input 502 may be stored to Data Input Buffer 510 in parallel or in serial fashion. The process block 602 may be followed by process block 604, which includes a data formatter that extracts 8 bits from the wide 192-bit data stored in Data Input Buffer 510 and forms the narrow 8-bit input data 512.

The process block 604 may be followed by process block 606, which includes the disclosed function logic of the First Parity Generator 520 being used. In one embodiment, the function logic may convert the 8-bit input data 512 received from process block 604 to the 4-bit first parity 522.

The process block 606 may be followed by process block 608, which includes the Memory Array 530 for data to be stored into or fetched from. The process of data being stored into a memory array is called memory write. And the process of data being fetched from a memory array is called memory read.

The process block 608 may be followed by the decision/process block 610, which includes the Data Format Sync Controller 580 to signal if all the bits of the wide 192-bit data stored in Data Input Buffer 510 has been extracted to narrow 8-bit input data 512 and fed to the First Parity Generator 520 or not. Once the outcome of process block 610 is NO, then process block 604 follows until all data bits from Data input Buffer 510 are completed extracted. Once the outcome of process block 610 is YES, then process block 602 follows. The memory write process can go on and on. And it is independent of the memory read process which is discussed next.

Figure 7:
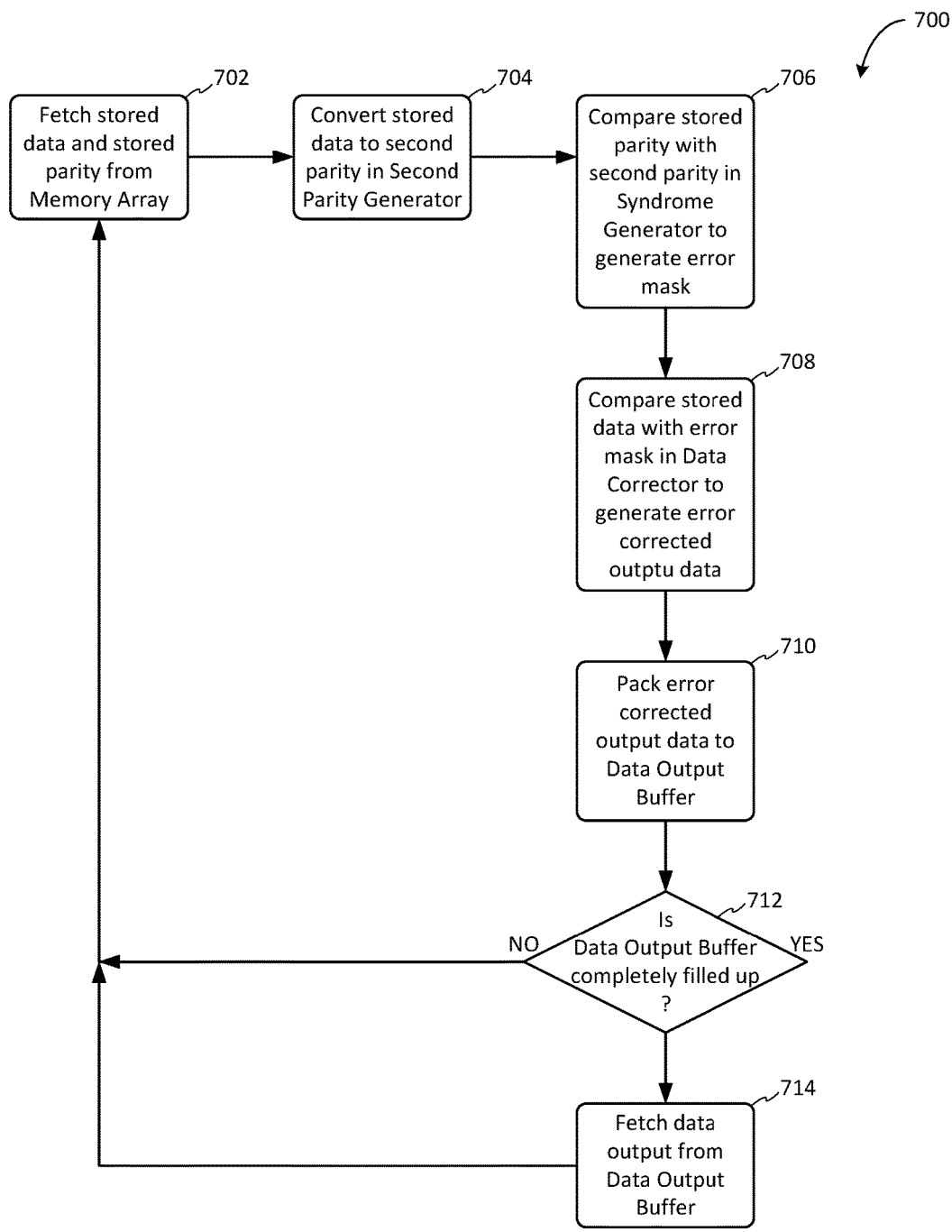
FIG. 7 is an illustrative flow chart of data read in accordance with an embodiment of the present disclosure.

FIG. 7 is an illustrative flow chart 700 of data read in accordance with an embodiment of the present disclosure. The flow chart 700 may illustrate a read process of the ECC memory using the disclosed function logic of the parity generator. The flow chart may begin at Fetch the memory array process block 702, which includes two sets of data being read out in parallel. The two sets of data are the stored data 532 and the stored parity 534.

In one embodiment, the stored data 532 may be 8 bits in data width, and the stored parity data may be 4 bits wide. The process block 702 may be followed by process block 704, which includes the disclosed function logic of the Second Parity Generator 540 being used. In one embodiment, the function logic in 540 may convert the 8-bit stored data 532 received from process block 702 to the 4-bit second parity 542.

The process block 704 may be followed by process block 706, which includes the Syndrome Generator 550 to compare between the stored parity 534 and the second parity 542. The comparison may yield the error mask 552. In one embodiment, the error mask 552 has 8 bits and is produced by using the error mask generating function disclosed in earlier sections.

The process block 706 may be followed by process block 708, which includes the Data Corrector 560 to output the error corrected output data 562 based on the stored data 532 and the error mask 552. The error corrected output data 562 is a function of the stored data 532 and the error mask 552. More specifically, bitwise speaking, any bit in error corrected output data 562 is an exclusive OR bit by bit of the corresponding bits of the stored data 532 and the error mask 552.

The process block 708 may be followed by process block 710, which includes the Data Output Buffer 570 to be filled up by the error corrected output data 562. In one embodiment, the received error corrected output data 562 may be 8 bits wide. The size of the Data Output Buffer 570 may be 192 bits wide. Therefore, it may take 24 iterations to fill all the buffer bits in Data Output Buffer 570.

The process block 710 may be followed by decision/process block 712, which includes the Data Format Sync Controller 580 to signal if all bits of the wide 192-bit buffer in Data Input Buffer 510 have been filled up by the narrow 8-bit input data 512 or not. Once the outcome of process block 712 is NO, then process block 702 follows until Data Output Buffer 570 is completely filled up with new data bits. Once the outcome of process block 712 is YES, then process block 714 follows.

The wide data output 572 is fetched from Data Output Buffer 570 in the process block 714. The memory read process can go on and on. And read process is independent of the memory write process which is described earlier.

The memory write process and memory read process form the complete ECC process. In one embodiment, the earlier disclosed chessboard pattern may be applied in the ECC process to test stuck to 0's, stuck to 1's, crosstalk from 0's to 1's, and crosstalk to 1's to 0's. In another embodiment, a flipped (or complemented, with 0's to 1's, and 1's to 0's) chessboard pattern may be applied in the ECC process to test, in compliment to the original chessboard pattern at each bit locations, the reversed behaviors of stuck to 1's, stuck to 0's, crosstalk from 1's to 0's, and crosstalk to 0's to 1's, respectively, The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An error-correcting code (ECC) memory, comprising:
a first parity generator configured to receive an input data of m bits and to output a first parity of k bits, wherein each of the k bits of the first parity is a first function of a selected number n of the m bits of the input data, where n and k are both less than m;
a memory array configured to receive the input data and the first parity and, wherein each corresponding bit of the input data and first parity is stored into a memory cell of said memory array and can be accessed as a stored data of m bits and a stored parity of k bits, respectively;
a second parity generator configured to receive the stored data and to output a second parity of k bits, wherein each of the k bits of the second parity is a second function of the selected number n of the m bits of the stored data;
a syndrome generator configured to receive the second parity and the stored parity, and to output an error mask of m bit in response, wherein the syndrome generator performs a bit-by-bit exclusive-OR of the second parity of k bits and the stored parity of k bits, and then outputs the error mask of m bits accordingly; and
a data corrector configured to receive the error mask and the stored data, and to provide an error corrected output data, wherein the error corrected output data is produced by a bit by bit exclusive-OR of the error mask and the stored data.

2. The ECC memory of claim 1, wherein the first function of the first parity generator is identical to the second function of the second parity generator.

3. The ECC memory of claim 1, wherein the first function generates each bit of the first parity of k bits to equal each bit of the input data of m bits, wherein every bit of the m bits has the same binary value of zero or one.

4. The ECC memory of claim 1, wherein the selected number n is an odd integer number.

5. The ECC memory of claim 1, wherein m, k, and n are each respectively 8, 4 and 5.

6. The ECC memory of claim 5, wherein for the input 8 bits of the first function consists of d1, d2, d3, d4, d5, d6, d7, and d8, and the output 4 bits of the first function consists of p1, p2, p3 and p4, and wherein
p1 is an exclusive-OR of d1, d2, d4, d5 and d7;
p2 is an exclusive-OR of d1, d3, d4, d6 and d7;
p3 is an exclusive-OR of d2, d3, d4, d5 and d8; and
p4 is an exclusive-OR of d3, d5, d6, d7 and d8.

7. The ECC memory of claim 6, wherein a Hamming distance of the first function and the second function is greater than or equal to three.

8. An image memory system, comprising:
a data input buffer configured to receive data input, wherein the data input buffer partitions data input into a plurality of internal data packages and outputs each of the same bit of the plurality of the internal data packages to form a plurality of input data;
a first parity generator configured to receive the input data of m bits and to output a first parity of k bits, wherein each of the k bits of the first parity is produced by a first function of a selected number n of the m bits of the input data, where n and k are both less than m;
a memory array configured to receive the input data and the first parity, wherein the input data and the first parity are stored into said memory array as a stored data and a stored parity, respectively, prior to be fetched by a parity generator, a syndrome generator and a data corrector;
a second parity generator configured to receive the stored data and to output a second parity of k bits, wherein each of the k bits of the second parity is produced by a second function of the selected number n of the m bits of the stored data;
a syndrome generator configured to receive the stored parity and the second parity, and to output an error mask of m bit, wherein each of k bits from both the second parity and the stored parity are compared bit by bit, and decoded to produce the error mask of m bits;
a data corrector configured to receive the error mask and the stored data, and to provide an error corrected output data, wherein the error corrected output data is produced by a bit by bit exclusive-OR of the error mask and the stored data;
a data output buffer configured to receive error corrected output data from the data corrector and to output a data output; and
a display/storage configured to receive the data output.

9. The image memory system of claim 8, wherein the first function of the first parity generator is identical to the second function of the second parity generator.

10. The image memory system of claim 8, wherein the first function generates each bit of the first parity of k bits to equal each bit of the input data of m bits, wherein every bit of the m bits has the same binary value, wherein each bit of m-bit input data is set to the same value of 0 or 1.

11. The image memory system of claim 8, wherein the selected number n is an odd integer number.

12. The image memory system of claim 11, wherein m, k, and n are each respectively 8, 4 and 5, and wherein for the input 8 bits of the first function consists of d1, d2, d3, d4, d5, d6, d7, and d8, and the output 4 bits of the first function consists of p1, p2, p3 and p4, wherein
p1 is an exclusive-OR of d1, d2, d4, d5 and d7;
p2 is an exclusive-OR of d1, d3, d4, d6 and d7;
p3 is an exclusive-OR of d2, d3, d4, d5 and d8;
p4 is an exclusive-OR of d3, d5, d6, d7 and d8; and
a Hamming distance of the first function and the second function is greater than or equal to three.

13. The image memory system of claim 8, wherein the display/storage is selected from a group consisting of a liquid crystal on silicon display, a LCD display, and a LED display.

14. The image memory system of claim 8, wherein the display/storage is selected from a group consisting of a nonvolatile memory, a solid state drive, and a hard disk drive.

15. The image memory system of claim 8, wherein the memory array is a dynamic random access memory (DRAM).

16. A method of generating and using ECC for a memory, comprising:
receiving a data input by a data input buffer, wherein the data input buffer partitions data input into a plurality of internal data packages, and extracts each of a same bit of the plurality of the internal data packages to form a plurality of input data of m bits;
converting the input data to a first parity by a first parity generator, wherein the first parity generator calculates the input data of m bits and outputs the first parity of k bits, wherein each of the k bits of the first parity is a first function of a selected number n of the m bits of the input data, where n and k are both less than m;

storing the input data of m bits and the first parity of k bits to a memory array;

fetching the memory array to acquire a stored data of m bits and a stored parity of k bits;

converting the stored data to a second parity by a second parity generator, wherein the second parity generator converts the stored data of m bits outputs to a second parity of k bits, each of the k bits of the second parity is a second function of the selected number n of the m bits of the stored data;

comparing the stored parity of k bits and the second parity of k bits by a syndrome generator to generate an internal check bits of k bits, wherein the internal check bits of k bits is decoded to generate an error mask of m bits;

comparing the stored data of m bits and the error mask of m bits by a data corrector to generate a plurality of error corrected output data of m bits;

packeting a data output buffer with a plurality of the error corrected output data until the plurality of input data from the data input in data input buffer has been processed and the data output butter has been completed filled by the plurality of error corrected output data; and accessing the data output buffer to acquire an data output.

17. The method of claim 16, wherein the first function of the first parity generator is identical to the second function of the second parity generator.

18. The method of claim 16, wherein the first function generates each bit of the first parity of k bits to equal each bit of the input data of m bits, wherein every bit of the m bits has the same binary value, wherein each single bit of m bits of the input data is set to the same value of 0 or 1.

19. The method of claim 16, wherein the selected number n is an odd integer number.

20. The method of claim 19, wherein m, k, and n are each respectively 8, 4 and 5, and wherein the first function generates each single bit of the first parity to equal the value of each bit of said input data; wherein for the input 8 bits of the first function consisting of d1, d2, d3, d4, d5, d6, d7, and d8, and for the output 4 bits of the first function consisting of p1, p2, p3 and p4, the first function performs the following operation:

p1 is an exclusive-OR of d1, d2, d4, d5 and d7;
p2 is an exclusive-OR of d1, d3, d4, d6 and d7;
p3 is an exclusive-OR of d2, d3, d4, d5 and d8;
p4 is an exclusive-OR of d3, d5, d6, d7 and d8;
wherein the Hamming distance of the first function and the second function is greater than or equal to three.

* * * * *